United States Patent
Mulligan et al.

[11] Patent Number: 6,011,627
[45] Date of Patent: Jan. 4, 2000

[54] UNIVERSAL MAPPING TOOL

[75] Inventors: Vincent P. Mulligan, Port Ewen; Robert F. Florence, Jr.; Charles R. Tompkins, Jr., both of Poughkeepsie; Wing-Fung Yuen, Fishkill, all of N.Y.

[73] Assignee: International Business Machines Corporation, Armonk, N.Y.

[21] Appl. No.: 09/056,457

[22] Filed: Apr. 7, 1998

[51] Int. Cl.[7] .................................................. G01B 11/14
[52] U.S. Cl. ........................... 356/375; 381/247; 381/248
[58] Field of Search ..................................... 356/375, 381, 356/247, 248

[56]  References Cited

U.S. PATENT DOCUMENTS 5,270,560  12/1993  Cheng ........................................ 250/561
5,546,179  8/1996  Cheng ........................................ 356/73

*Primary Examiner*—Frank G. Font
*Assistant Examiner*—Reginald A. Ratliff
*Attorney, Agent, or Firm*—Ratner & Prestia; Tiffany L. Townsend

[57]  ABSTRACT

A universal mapping tool and method for mapping workpieces, such as semiconductor devices, is disclosed and described. The tool comprises a fixed and a movable gripping means adapted to mount a wide range of workpieces, means for optically locating the physical center of the workpiece fiducials mounted on the gripping means, and means for interpreting and storing the data obtained in the mapping operation.

16 Claims, 4 Drawing Sheets

UNIVERSAL MAPPING TOOL

BACKGROUND OF THE INVENTION

The present invention relates to a universal mapping tool and to a method for mapping the X, and Y, positions of features positioned on a workpiece, such as a semiconductor device, with respect to each other and with respect to the physical center of the workpiece, and also mapping the elevation positions or Z coordinates of the surface on which such features are positioned.

Semiconductor devices such as semiconductor chips and circuit boards on which such chips are mounted are manufactured to precise standards with respect to the location of features, such as circuitry and circuitry contact points and chip locations. However, minor variations occur in the location of such features due to minor differences in manufacturing processes, such as expansion and contraction differences which may occur in forming such semiconductor devices. Accordingly, it is necessary to accurately map the positions of each such feature, or at least of many such features on each such semiconductor device and to create a data file for each such device which indicates the precise position or coordinates, both vertical (Z) and horizontal (X,Y), in order to later locate such features for testing of circuits and other such features.

One prior art method of mapping such devices involves the use of a mechanical fixturing tool in which an eccentric cam rotates an actuator ring on which two gripping means are slidably mounted equidistant from the precise center (origin) of the workspace. As the actuator ring rotates into the closed position, the two gripping means move equidistantly inwardly toward each other and grasp the corners of a square or rectangular workpiece, thereby placing the physical center of the workpiece directly over the origin. A top gripper plate positions the top surface of the workpiece at a predefined elevation, applying pressure to a linear voltage differential transformer (LVDT) sensor positioned at the center of the work area, which is compressed by the bottom surface of the workpiece to measure the thickness of the work piece.

While such prior art devices accurately map the desired features of a workpiece, they are cumbersome, unduly expensive, and lack sufficient flexibility. One major disadvantage is that they are not sufficiently flexible to adapt to a wide range of workpiece sizes. Thus, it is frequently necessary when changing from one size workpiece to another, to have to shut down and replace the mechanical grippers to ones which are longer or shorter.

The present invention provides an inexpensive and efficient apparatus for automatically mapping workpieces of various sizes and shapes without altering the mechanical fixturing of the apparatus. These advantages are achieved in the present invention by providing a fixed gripping means and a movable gripping means in which the latter is adapted to move toward and away from the fixed gripping means in order to accommodate a wide range of workpiece sizes and shapes. It is a further advantage that the present invention provides means for optically measuring and recording the precise physical center of the workpiece, and other positions relative thereto, including the thickness of the workpiece or an elevation on it, from the relative positions of the fixed and movable gripping means.

SUMMARY OF THE INVENTION

In accordance with the present invention, there is provided a universal mapping tool. The tool includes a platform having a work surface for support of a workpiece. A first gripping means is in a fixed position on the work surface and defines one limit of a workspace on the work surface. The fixed gripping means has two spaced contact surfaces to contact adjacent edges of a workpiece. A fixed fiducial or optically readable reference point is provided in a fixed spatial relationship relative to the fixed gripping means, preferably on the gripping means itself. A second gripping means is movably positioned on the work surface to move toward and away from the first gripping means and defines a second limit of the workspace. The second gripping means also has two spaced contact surfaces to contact adjacent edges of the workpiece. It is also provided an optically readable reference point or fiducial which is fixed on and movable with the movable gripping means. Optical viewing/focusing means are movably mounted over the work surface for detecting the fixed and movable reference points and developing indications of the locations of such reference points and the locations and orientation of features on the workpiece. The tool is also provided with means for interpreting the indications and calculating therefrom the positions of the edges of the workpiece, the physical center of the workpiece, and the positions of various features on the workpiece in relation to the physical center of the workpiece.

A second embodiment is also provided comprising a method for mapping the positions of features present on a workpiece comprising: (a) mounting diagonally opposite edges of a workpiece between a fixed gripping means and a movable gripping means adapted for movement toward and away from the fixed gripping means, in which each of the gripping means is provided with two contact points for gripping contact with adjacent edges of the workpiece and an associated optically readable reference point; (b) optically determining the position, $X_1$, $Y_1$, of the optically readable reference point associated with the fixed gripping means having known offsets, $\Delta X_1$ and $\Delta Y_1$ between the reference point and the corresponding contact points of the fixed gripping means; (c) optically determining the position, $X_2$, $Y_2$, of the optically readable reference point on the movable gripping means having known offsets, $\Delta X_2$ and $\Delta Y_2$ between the reference point and the corresponding contact points of the movable gripping means; (d) determining from such optically determined values the position of physical center of the workpiece, then (e) optically reading and recording the position of other features on such workpiece relative to the relative to the position for the physical center of the workpiece.

These and other objects and advantages of the invention will become apparent to those skilled in the art from the following detailed description of the invention.

DETAILED DESCRIPTION

Figure 2:
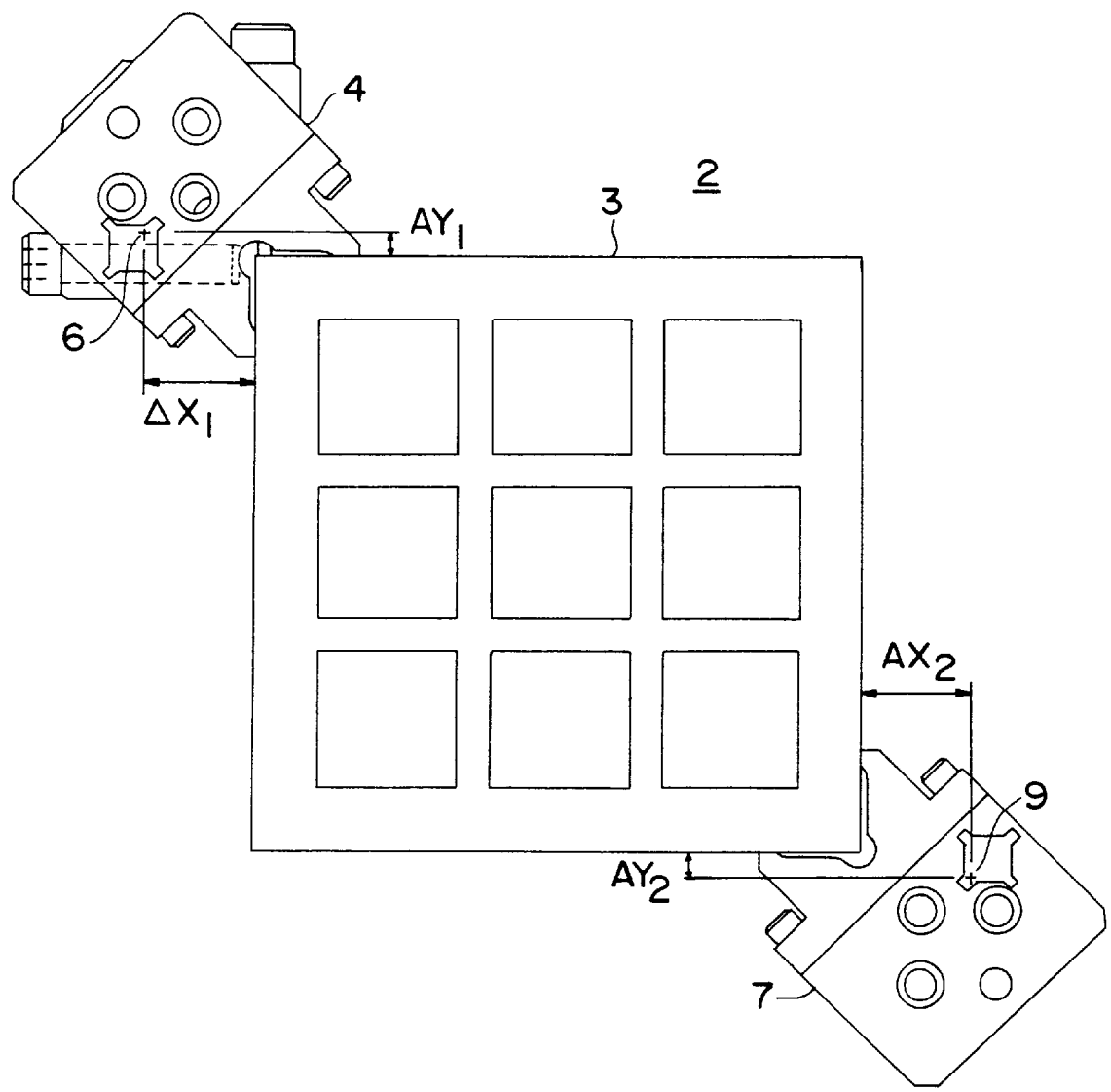
FIG. 2 is an exploded top view of the gripping means and workpiece illustrating the offset values used for calculation of the coordinates of the physical center of the workpiece and features on the workpiece.
Figure 3:
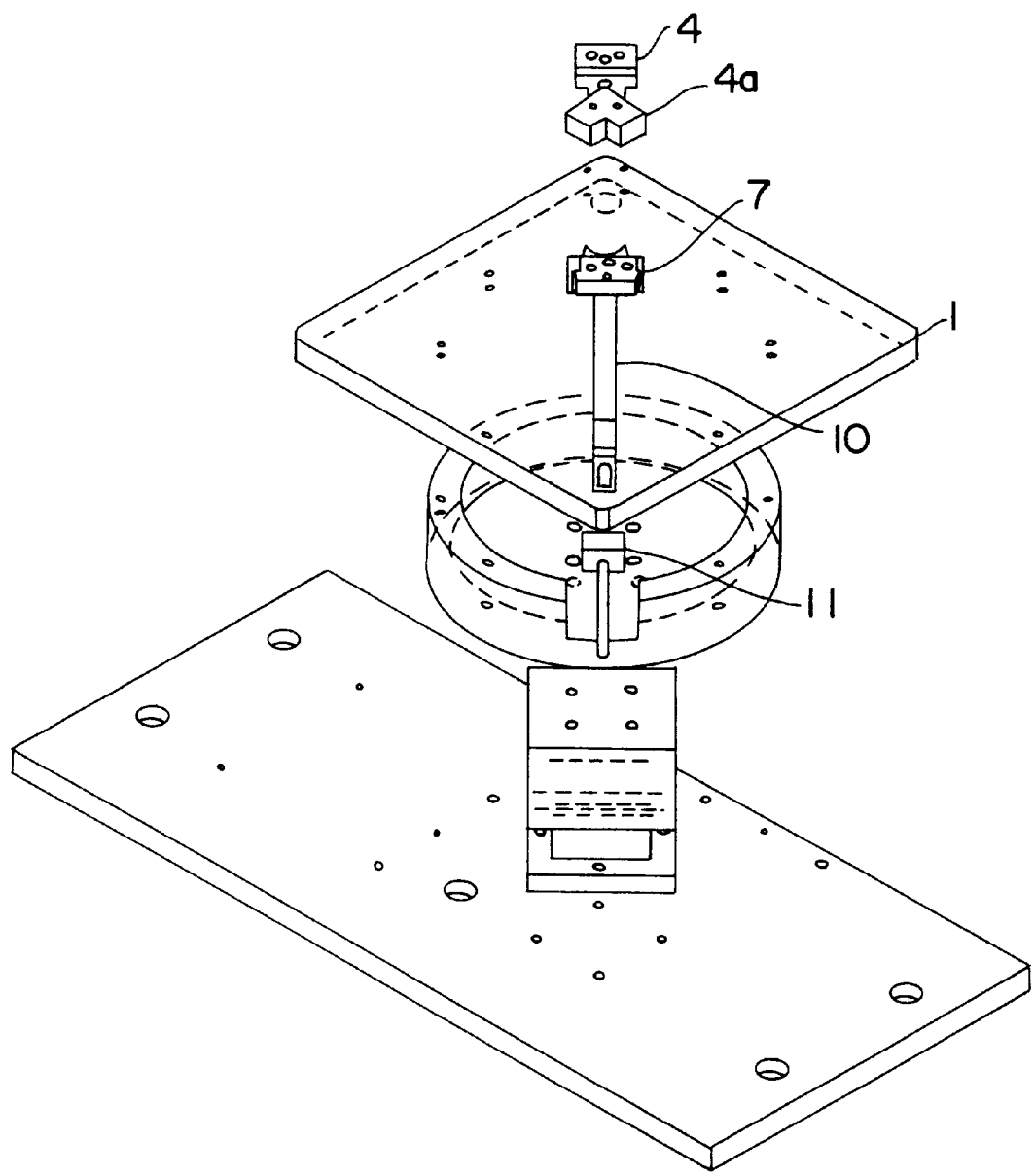
FIG. 3 is a isometric view illustrating the construction of the work platform and a preferred embodiment operative parts
Figure 4:
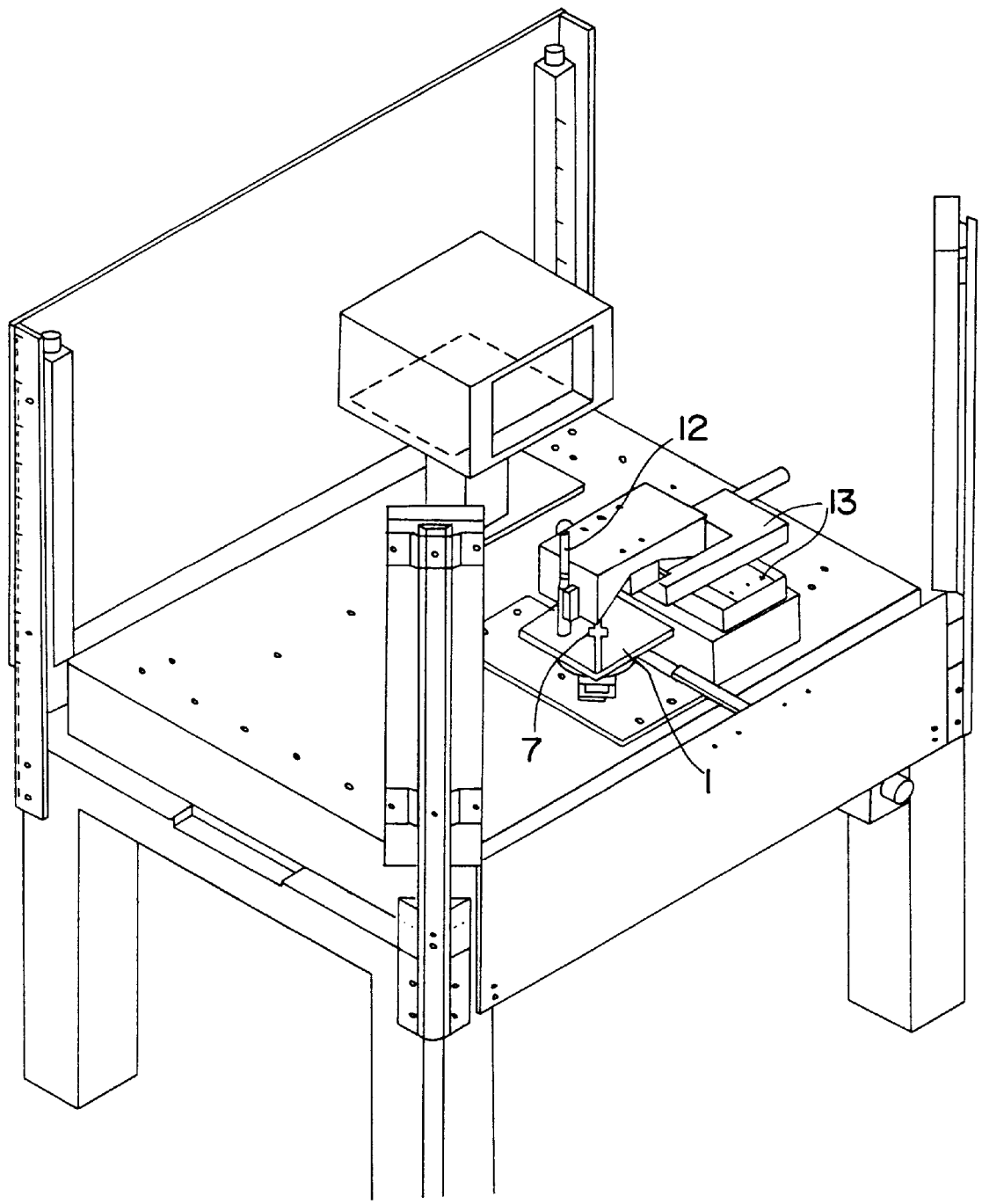
FIG. 4 is a isometric view of the universal mapping tool illustrating the interrelationship of the various components of preferred embodiment of the tool.

Referring to FIGS. 1 through 4 above, a preferred embodiment comprises a universal mapping tool for mapping features on a workpiece such as a semiconductor device. As shown in the drawings the universal mapping tool shown generally in FIG. 4 is provided with a work platform 1. The platform may be constructed of any suitable material and may vary widely in surface area depending on the size of workpieces for which the platform is intended to be used. The size and materials of construction are thus a matter of choice and not critical to the invention. The platform has a work surface, shown generally at 2, having sufficient surface area to provide adequate workspace between gripping means 4 and 7 to accommodate various sized work pieces 3 and to accommodate movement the movable gripping means as described below.

Figure 1:
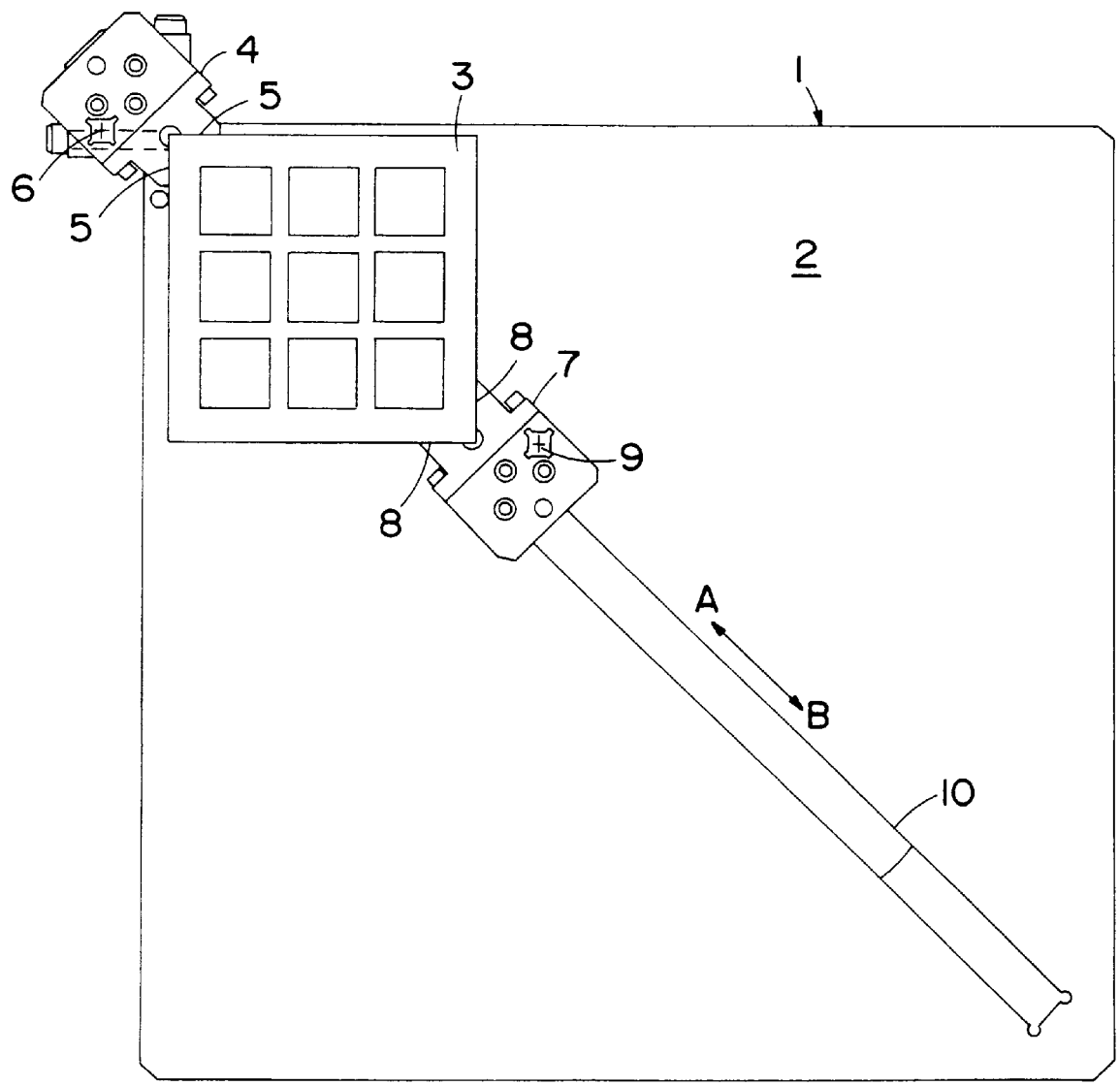
FIG. 1 is a top view illustrating the work platform, a semiconductor workpiece on the workspace, and fixed and movable gripping of the present invention.

A first gripping means 4 is in a fixed position on the work surface 2 of the platform 1. The first gripping means is provided with two spaced contact surfaces 5. These surfaces are adapted to contact and grip adjacent edges of the workpiece 3 and thereby define one limit of the workspace on the work surface of the platform. That is, it provides an envelope defining the placement of one corner of the workpiece 3. The first gripping means is also provided with an associated optically readable reference point or fiducial 6. As shown in FIGS. 1 and 2, the fixed fiducial 6 associated with fixed gripping means 4 is preferably located at a fixed position on the gripping means itself. However, this fiducial may optionally be located at another optically readable fixed position on or adjacent to the work surface, as long as it is in a fixed spatial relationship to fixed gripping means 4. This reference point is optically readable and provides essential information as to the position of the edges of the workpiece, the physical center of the workpiece, the elevation (thickness) of the workpiece) and the location of various components or features of the workpiece relative to the physical center and orientation of the workpiece.

The universal mapping tool of this invention is also provided with a second movable gripping means 7. This gripping means is movably positioned on the work surface and adapted to move toward and away from the fixed gripping means in the directions indicated by "A" and "B", respectively, in order to accommodate various sized workpieces on the work surface. Like the first gripping means, the second gripping means thereby defines a second limit of the workspace on the platform which is proportional in size to its position on the A-B axis shown in FIG. 1. The second gripping means also has two spaced contact surfaces 8 to contact adjacent edges of the workpiece at a position diagonally opposite the edges contacted by the first gripping means, and an optically readable reference point 9, which serves the same function as reference point 6 associated with fixed gripping means 4, but for determining the relative position of the opposite corner of the workpiece 3.

In the preferred embodiment, the fixed and movable reference points or fiducials are in a fixed position on gripping means 4 and 7 respectively and may advantageously be chrome plated metal with the optically readable reference mark or point of any type etched therein or printed thereon. It will thus be apparent that in the preferred embodiment the gripping means 4 and 7 are identical and interchangeable, except that gripping means 4 is mounted in a fixed position with mounting bracket 4a, shown in FIG. 3, whereas gripping means 7 is mounted for movement along the A-B axis to accommodate workpieces of various sizes. To accommodate such movement, platform 1 is provided with a precision slot 10 in which the second gripping means is slidably mounted. As best seen in FIG. 3, gripping means 7 is movably connected to an actuator means 11 for moving gripping means 7 toward or away from gripping means 4 along axis A-B and into and out of gripping contact with a workpiece positioned on the workspace of the platform. Suitably actuator means 11 is mounted in any suitable manner under platform 1 and is preferably an air actuated piston or other piston device connected in a known manner either directly or indirectly to gripping means 7.

In the preferred embodiment, the throw of actuator 11 and the distance of travel of gripping means 7 along axis A-B is sufficient to accommodate a workpiece that has a corresponding axis of from about 25 to about 500 mm. Stated otherwise, gripping means 7 must, in order to accommodate workpieces over that entire size range, be mounted for movement along axis A-B a distance of 225 mm or greater, preferably to have the ability to move sufficiently close to gripping means 4 to effectively grip a workpiece that is as small as about 20 mm square, and conversely to a accommodate larger workpieces up to about 160 mm square. It will of course be understood by those skilled in the art that by utilizing a larger platform, a piston with a longer throw, and/or a longer precision slot in the platform, the present invention can be adapted to handle much larger workpieces as well without departing from the spirit and scope of this invention.

As seen in the drawings the workpiece us usually square, but it is also contemplated that the invention may be adapted to handle rectangular work pieces as well by utilizing a platform in which the A-B axis and the orientation of the fixed and movable gripping means bearing are aligned with the axis of a line from one corner of the workpiece to the diagonally opposite corner of the workpiece. It is also contemplated that this same effect may be achieved by utilizing a square workpiece holder for the workpiece in which the X and Y offsets are known or optically determinable from fiducials on the workpiece or holder for the workpiece. With such adaptations, which will be apparent to those skilled in the art, the workpieces mapped in accordance with the present invention may be square or rectangular without departing from the spirit and scope of the present invention.

As best seen in FIG. 4, the universal mapping tool of the present invention is also provided with optical viewing/recording means shown generally at 12. Optical means 12 is movably positioned over the work surface for travel over the entire work surface, including over the reference points 6 and 9. Optical means 12 is adapted for detecting the reference points 6 and 9 and developing indications of the locations of the reference points and the locations and orientation of features on the workpiece. Optical means 12 is suitably a camera mounted on an X, Y, table 13 to record the lateral displacement of reference points and features on the workpiece on X and Y axes. It also records the elevation (thickness) of the workpiece or a feature of the workpiece on the Z axis, suitably by raising or lowering the optics system to focus on the point in question. In the preferred embodiment shown in the drawings, a fixed focus camera is utilized. However, it will be understood by those skilled in the art that, in lieu of a camera, the function of optical means 12 may be performed equally well performed by a microscope or optical devices other than a camera which are capable of selectively establishing the positions on the X axis of the various elements. It will also be apparent to those skilled in the art that the same result may be achieved by utilizing auto-focus optics and electronically determining the elevation of the feature on the workpiece from the focal length when the camera has located the feature in question. In addition, it will be appreciated by those skilled in the art that the reverse configuration in which the optics are fixed and the platform is movable along the X, Y, and Z axes may also be utilized. Such equivalents are contemplated by within the spirit and scope of this invention. Preferably the device should have an accuracy of about 1 micron for the X and Y axes and an accuracy of about 0.5 micron for the Z axis.

Further, with reference to FIG. 4, it will be understood by those skilled in the art that the mounting for the platform and the mounting for the camera and the X, Y, Z boards are such that each is level with respect to the other. Stated otherwise, the mountings are such that, as the camera travels above the platform through various X, Y positions on a given X axis, the distance between the camera lens and the platform surface will be identical at all points on the surface of the platform.

The universal mapping tool of the present invention is also provided with means (not shown in the drawings) for interpreting the indications and calculating therefrom the positions of the edges of the workpiece, the physical center of the workpiece, and the positions of various features on the workpiece in relation to the physical center of the workpiece. This aspect of the invention suitably comprises a computer or other electronic recording means preferably adapted to receive data directly from optical means 12, including software for converting the data received into coordinates locating the recorded positions and storing them in a data file for the individual workpiece. That data file may then be used as a driver to drive diagnostic equipment such as probe test tools, component place tools or any other type of tools that need the exact coordinates of chip or circuit location for that workpiece. Further, it is desirable that the optical means have approximately 1 inch of travel along the Z axis to accommodate workpieces of up to 1 inch thick.

Having thus described the physical characteristics of the present universal mapping tool, the following describes its use for mapping the features of a workpiece.

Prior to initial use of the tool it is first necessary to calibrate it. For this purpose a standardized workpiece is utilized. The standard is machine-ground square and has fiducials etched into it. These fiducials have known coordinates that define an origin which is located at the physical center of the standard. The standard is used to determine the offset values, $\Delta X_1$, $\Delta X_2$, $\Delta Y_1$, and $\Delta Y_2$ for the contact surfaces on the gripping means as shown in FIG. 2. These values are determined as follows. The standard is mounted in the gripping means so that the contact points of the gripping means are in contact with the sides of the standard. The camera is positioned over the fixed fiducial and performs an auto focus so that the image of the fiducial is clear. The fiducial is located in the field of view (FOV) and the position of the camera is adjusted as needed so that the center of the fiducial is located at the pixel center of the FOV. This is repeated for each of the gripping means. The camera is then positioned over one or more (preferably at least three) fiducials etched on the standard. This defines the origin of the coordinate system for the standard, with the origin being at the physical center of the standard. The positions of the fiducials on the gripping means and those on the standard are then used to determine the X,Y offsets for the gripping means. Since the size (width and height) of the standard is known, one-half of the width or height of the standard added to (or under appropriate conditions subtracted from) the origin provides the position where the contact surfaces of the gripping means touch the edges of the standard. These delta X,Y values are saved and used for the normal mapping operations.

The mapping is conducted in substantially the same manner as the standardization procedure. The workpiece is loaded on the workspace and chucked between the gripping means so that the two contact surfaces of each gripping contact the edges of the workpiece. The camera is then positioned over the fixed fiducial and performs an auto focus so that the image is clear. The camera position is adjusted by the positioning system until the center of the fiducial is located at the pixel center of the FOV. The positioning system coordinates are saved as X1 and Y1 and the Z motor position is saved for calculating the thickness of the part. The camera is then positioned over the movable gripping means and again performs an auto-focus on the fiducial so that its image is clear, and is then positioned so that the fiducial is located at the pixel center of the FOV. The positions of coordinates X2 and Y2 are then saved.

From these values and the delta values previously established for the offsets for the contact surfaces, the position of (coordinates for) the exact physical center of the workpiece is calculated.

Having thus determined the coordinates for the physical center of the workpiece, the optical means can then be positioned over any point on the surface of the workpiece and record the actual location (coordinates) of the feature at that point relative to the exact physical center and compare that position with nominal (standard) values for that particular workpiece and each feature on that workpiece. The values obtained from these mapping operations are then saved to a file that contains all the updated site centers on the work piece, including the rotation with respect to the standard and the thickness or elevation of the site and/or workpiece.

In practice the X,Y mapping of features described generally above is actually driven by processing a script file that describes the features to map for each type of part. The file will position the camera over a set of nominal coordinates from the physical center. That is, the XY values for the desired location are added to the XY coordinates of the physical center, and the positioning system moves the optics to that location. The feature will be present somewhere in the FOV, but not necessarily at the exact pixel center of the FOV. The positioning system then repositions the optics to locate the feature at the exact center of the FOV, and the coordinates of this position are then saved. This is then repeated for all points described in the script file. When this operation is complete the system has two values for each point located, the nominal XY value and the new actual XY values. The XY values for the physical center of the workpiece are subtracted from the actual XY values for each feature to provide the actual value for the position of the feature relative to the physical center of the workpiece.

Measurements of thickness and/or elevation for the features on the workpiece are also preferably automatically obtained. The universal mapping tool makes use of an autofocus routine that analyzes the histogram of the image and adjusts the Z axis until image sharpness is peaked. This routine is first performed for the fixed fiducial associated with the fixed gripping means, and that value is saved. Once the mapping of the workpiece surface is completed, the auto-focus routine is run again and the Z axis position for the surface of the workpiece is obtained and saved. Since the elevation of the fixed fiducial associated with the fixed gripping means is fixed relative to the work surface of the tool, subtraction of the Z value for the workpiece from the Z value of the fixed fiducial provides the thickness of the workpiece. This value is then saved for use by another tool using the map file generated from the above described mapping procedure.

What is claimed is:

1. A universal mapping tool comprising:
   (a) a platform having a work surface for support of a workpiece;
   (b) a first gripping means in a fixed position on the work surface and defining one limit of a workspace on the work surface, the first gripping means capable of contacting adjacent edges of a workpiece;
   (c) an optically readable reference point in a fixed spatial relationship with said first gripping means;
   (d) a second gripping means positioned on the work surface to move toward and away from the first gripping means and defining a second limit of the workspace, the second gripping means capable of contacting adjacent edges of the workpiece and an optically readable reference point;
   (e) optical viewing/recording means movably mounted over the work surface for detecting such reference points and developing indications of the locations of said reference points and the locations and orientation of features on the workpiece; and
   (f) means for interpreting the indications and calculating therefrom the positions of the edges of the workpiece, the physical center of the workpiece, and the positions of various features on the workpiece in relation to the physical center of the workpiece.

2. The universal mapping tool of claim 1 in which the platform is provided with a precision slot in which the second gripping means is slidably mounted.

3. The universal mapping tool of claim 2 in which the second gripping means is operably connected to means for moving said second gripping means toward and away from the first gripping means and into and out of contact with a workpiece positioned on the workspace of the platform.

4. The universal mapping tool of claim 3 in which the means for moving the second gripping means is a piston adapted to move said second gripping means toward and away from said first gripping means.

5. The universal mapping tool of claim 4 in which said second gripping means when moved fully toward and fully away from the first gripping means defines a workspace sufficient to grip a rectangular workpiece having a diagonal size in the range of 50 to 500 mm.

6. The universal mapping tool of claim 1 in which an optically readable reference point is a fiducial on each gripping means.

7. The universal mapping tool of claim 6 in which the fiducial is chrome plated metal into which the reference point is etched.

8. The universal mapping tool of claim 1 in which the optical viewing/recording means is a camera.

9. The universal mapping tool of claim 8 in which the camera is mounted on an X, Y, Z table and adapted to record the lateral displacement of reference points and on the workpiece on X and Y axes, and to record the elevation of the workpiece or a feature of the workpiece on the Z axis.

10. The universal mapping tool of claim 9 in which the data read by the camera is stored in a data file for each workpiece tested.

11. A method for mapping the positions of features present on a workpiece comprising:
    (a) Mounting diagonally opposite edges of a workpiece between a fixed gripping means and a movable gripping means adapted for movement toward and away form the fixed gripping means, in which each of the gripping means is provided with at least one contact for gripping contact with adjacent edges of the workpiece and an optically readable reference point;
    (b) Optically determining the position, $X_1$, $Y_1$, of the optically readable reference point on the first gripping means having known offsets, $\Delta X_1$ and $\Delta Y_1$ between the reference point and the corresponding contact points of that gripping means;
    (c) Optically determining the position, $X_2$, $Y_2$, of the optically readable reference point on the movable gripping means having known offsets, $\Delta X_2$ and $\Delta Y_2$ between the reference point and the corresponding contact points of that gripping means;
    (d) Determining from such optically determined values the position of physical center of the workpiece, then
    (e) Optically reading and recording the position of other features on such workpiece relative to the relative to the position for the physical center of the workpiece.

12. The method of claim 11 in which the positions are recorded as position coordinates with a camera movably mounted over the workpiece on an X, Y, board.

13. The method of claim 11 which additionally includes the steps of:
    (a) Optically determining the elevation position, $Z_1$ of the optically readable reference points on at least one of the gripping means having known offset, $\Delta Z_1$ from a work surface on which the workpiece is mounted;
    (b) Optically determining the elevation position, $Z_2$ of the feature for which the X,Y coordinates are being measured on the workpiece, or of the surface on which such feature is positioned, relative to position $Z_1$ of the optically readable reference points on the gripping means or relative to the work surface on which the workpiece is positioned.

14. The method of claim 13 in which the positions are recorded with a camera movably mounted over said workpiece on an X, Y, Z board.

15. The method of any of claims 11, 12, 13, and 14 wherein the recorded values are recorded in an electronic data file for each workpiece.

16. The method of claim 15 wherein the electronic data file accompanies the workpiece and is utilized to drive Step and Repeat probe heads to the location of the desired features on the workpiece for testing of the location and functionality of modules or circuitry on the workpiece.

* * * * *

UNITED STATES PATENT AND TRADE MARK OFFICE
CERTIFICATE OF CORRECTION

PATENT NO. : 6,011,627
DATED : January 4, 2000
INVENTORS : Vincent P. Mulligan et al.

It is certified that error appears in the above-identified patent and that said Letters Patent is hereby corrected as shown below:

In column 2, line 47, delete the second occurrence of "relative to the";

In column 2, line 64, insert a period at the end of the sentence;

In column 4, line 28, delete "us" and insert --is--;

In column 8, claim 11, line 11, delete "form" and insert
--from--;

In column 8, claim 11, line 28, delete the second occurrence of "relative to the".

Signed and Sealed this

Twentieth Day of February, 2001

Attest:

NICHOLAS P. GODICI

Attesting Officer     *Acting Director of the United States Patent and Trademark Office*